United States Patent
Jeong et al.

(10) Patent No.: US 9,561,521 B2
(45) Date of Patent: Feb. 7, 2017

(54) COATING APPARATUS INCLUDING NOZZLE CLEANING MECHANISM AND METHOD OF FORMING COATING LAYER USING THE SAME

(75) Inventors: Tae-Kyun Jeong, Gyeonggi-do (KR);
Kyong-Deuk Jeong, Seoul (KR);
Jong-Ik Park, Gyeonggi-do (KR);
Myung-Shik Kim, Gyeonggi-do (KR);
Hyoung-Won Kim, Gyeonggi-do (KR);
Dong-Ki Shin, Gyeonggi-do (KR);
Jeong-Hak Choi, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 989 days.

(21) Appl. No.: 12/980,531

(22) Filed: Dec. 29, 2010

(65) Prior Publication Data
US 2012/0107514 A1 May 3, 2012

(30) Foreign Application Priority Data

Oct. 27, 2010 (KR) .................. 10-2010-0105626

(51) Int. Cl.
*B05C 3/10* (2006.01)
*B05B 15/02* (2006.01)
(Continued)

(52) U.S. Cl.
CPC ......... *B05B 15/0225* (2013.01); *B05B 15/025* (2013.01); *B05B 15/10* (2013.01);
(Continued)

(58) Field of Classification Search
CPC .............. B05C 5/00; B05C 11/00; B05C 3/10; B05C 3/09; B05C 11/11; B05B 15/02; B05B 15/025; B05B 15/10; G03F 7/16; H01L 21/67051; Y10S 134/902; B41J 2/16547; B95D 1/005; G11B 7/266
(Continued)

(56) References Cited

U.S. PATENT DOCUMENTS 3,675,622 A * 7/1972 Griffin .................... 118/421
3,823,687 A * 7/1974 McGlashen .............. 118/421
(Continued)

FOREIGN PATENT DOCUMENTS

JP 2008-136897 A 6/2008
JP 2009-136756 A 6/2009

OTHER PUBLICATIONS

Korean Office Action dated Jun. 21, 2013 for corresponding Korean Patent Application No. 10-2010-0105656.
(Continued)

*Primary Examiner* — Karl Kurple
(74) *Attorney, Agent, or Firm* — Morgan, Lewis & Bockius LLP

(57) ABSTRACT

A coating apparatus includes: a nozzle having a nozzle front end configured to spray a coating solution and a head configured to store the coating solution; a movement axis configured to cause the nozzle to move back and forth in a straight line; a rotating connection member configured to connect the movement axis with the nozzle and allow the nozzle to rotate; a stage disposed under the movement axis; and a cleaning means disposed at an end of the movement axis, and having a nozzle front end insertion unit in a concave shape of the nozzle front end and a base fixing the insertion unit, wherein the nozzle is fixed in a normal direction of a surface of the stage by the movement axis,
(Continued)

moves back and forth in an extension direction of the movement axis, and rotates with respect to the movement axis.

10 Claims, 6 Drawing Sheets

(51) Int. Cl.
*B05B 15/10* (2006.01)
*B05D 1/26* (2006.01)
*C03C 17/00* (2006.01)
*G03F 7/16* (2006.01)
B05C 3/09 (2006.01)
B05C 11/11 (2006.01)
H01L 21/67 (2006.01)
B41J 2/165 (2006.01)
B05D 1/00 (2006.01)
G11B 7/26 (2006.01)
B05D 1/02 (2006.01)

(52) U.S. Cl.
CPC .............. *B05C 3/10* (2013.01); *B05D 1/26* (2013.01); *C03C 17/002* (2013.01); *G03F 7/16* (2013.01); B05C 3/09 (2013.01); B05C 11/11 (2013.01); B05D 1/005 (2013.01); B05D 1/02 (2013.01); B41J 2/16547 (2013.01); G11B 7/266 (2013.01); H01L 21/67051 (2013.01); Y10S 135/902 (2013.01)

(58) Field of Classification Search
USPC .............. 118/421, 319; 347/29; 134/902
See application file for complete search history.

(56) References Cited

U.S. PATENT DOCUMENTS

| | | | | |
|---|---|---|---|---|
| 4,840,821 | A * | 6/1989 | Miyazaki et al. | 427/430.1 |
| 5,199,988 | A * | 4/1993 | Kamezaki et al. | 118/52 |
| 5,298,288 | A * | 3/1994 | Curry, II | B05D 3/0254 |
| | | | | 427/314 |
| 5,558,714 | A * | 9/1996 | Watanabe et al. | 118/421 |
| 6,159,291 | A * | 12/2000 | Morita et al. | 118/321 |
| 6,178,780 | B1 * | 1/2001 | Morita | 65/395 |
| 6,371,667 | B1 * | 4/2002 | Kitano et al. | 396/611 |
| 6,588,874 | B2 * | 7/2003 | Tsuchiya et al. | 347/29 |
| 6,858,088 | B1 * | 2/2005 | Dress | B05C 11/08 |
| | | | | 118/50 |
| 7,344,600 | B2 * | 3/2008 | Inada et al. | 118/321 |
| 7,485,346 | B2 * | 2/2009 | Bem et al. | 427/421.1 |
| 7,608,150 | B2 * | 10/2009 | Park | B05B 12/12 |
| | | | | 118/302 |
| 7,640,885 | B2 * | 1/2010 | Nakashima et al. | 118/302 |
| 7,677,195 | B2 * | 3/2010 | Lee | B41J 11/0015 |
| | | | | 118/305 |
| 7,823,534 | B2 * | 11/2010 | Ookouchi et al. | 118/663 |
| 7,918,532 | B2 * | 4/2011 | Shimazaki | 347/29 |
| 8,062,922 | B2 * | 11/2011 | Britt | C23C 18/1204 |
| | | | | 427/217 |
| 8,117,981 | B2 * | 2/2012 | Nishimura et al. | 118/52 |
| 8,414,972 | B2 * | 4/2013 | Yoshihara et al. | 427/240 |
| 2001/0050050 | A1 * | 12/2001 | Nishiya et al. | 118/668 |
| 2003/0159651 | A1 * | 8/2003 | Sakurada | B05B 12/122 |
| | | | | 118/52 |
| 2004/0041876 | A1 * | 3/2004 | Uchida et al. | 347/29 |
| 2004/0246282 | A1 * | 12/2004 | Usui | B41J 2/16508 |
| | | | | 347/6 |
| 2005/0089790 | A1 * | 4/2005 | Lee et al. | 430/141 |
| 2005/0145168 | A1 * | 7/2005 | Inada et al. | 118/416 |
| 2005/0217573 | A1 * | 10/2005 | Kwon | B05C 5/0254 |
| | | | | 118/323 |
| 2006/0032440 | A1 * | 2/2006 | Nolan | C23C 14/228 |
| | | | | 118/715 |
| 2006/0141130 | A1 * | 6/2006 | Kwon et al. | 427/58 |
| 2006/0207646 | A1 * | 9/2006 | Terreau | B32B 17/10018 |
| | | | | 136/251 |
| 2007/0020401 | A1 * | 1/2007 | Park | B05B 12/12 |
| | | | | 427/424 |
| 2007/0102021 | A1 * | 5/2007 | Nappa et al. | 134/2 |
| 2007/0184178 | A1 * | 8/2007 | Yamamoto | G03F 7/3028 |
| | | | | 427/8 |
| 2007/0245953 | A1 | 10/2007 | Nakashima et al. | |
| 2009/0033707 | A1 | 2/2009 | Shimazaki | |
| 2009/0061642 | A1 * | 3/2009 | Ha | 438/745 |
| 2009/0066976 | A1 * | 3/2009 | Uchida et al. | 358/1.7 |
| 2009/0130614 | A1 * | 5/2009 | Ookouchi et al. | 430/434 |
| 2009/0250079 | A1 * | 10/2009 | Yoshihara et al. | 134/4 |
| 2009/0311434 | A1 * | 12/2009 | Inamasu et al. | 427/424 |
| 2009/0318051 | A1 * | 12/2009 | Lee et al. | 445/61 |
| 2010/0112209 | A1 * | 5/2010 | Yoshihara et al. | 427/240 |
| 2011/0059246 | A1 * | 3/2011 | Miyamoto | H01L 21/6715 |
| | | | | 427/345 |
| 2012/0298036 | A1 * | 11/2012 | Ogawa | B41J 2/165 |
| | | | | 118/712 |
| 2013/0118533 | A1 * | 5/2013 | Takiguchi et al. | 134/26 |
| 2013/0182039 | A1 * | 7/2013 | Berry et al. | 347/33 |
| 2013/0239887 | A1 * | 9/2013 | Yoshihara et al. | 118/697 |

OTHER PUBLICATIONS

Text of the First Office Action dated Apr. 14, 2014 from the Taiwan Intellectual Property Office in counterpart TW application No. 099145872.

* cited by examiner

COATING APPARATUS INCLUDING NOZZLE CLEANING MECHANISM AND METHOD OF FORMING COATING LAYER USING THE SAME

This application claims the benefit of Korean Patent Application No. 10-2010-0105626, filed on Oct. 27, 2010, which is hereby incorporated by reference in its entirety.

BACKGROUND OF THE INVENTION

Field of the Invention

The present invention relates to a coating apparatus used for a photoresist (PR) or organic material coating process among liquid crystal display (LCD) manufacturing processes, and more particularly, to a coating apparatus capable of managing a front end of a nozzle without priming and a method of forming a coating layer using the coating apparatus.

Discussion of the Related Art

In general, a process of manufacturing a liquid crystal display module employing a thin film transistor (TFT) is divided into a TFT process, a cell process, and a module process.

In the TFT process, a TFT is repeatedly formed in an array on a glass substrate. The TFT process includes a plasma enhanced chemical vapor deposition (PECVD) process of introducing a gas required for deposition into a vacuum chamber, and transforming the introduced gas into plasma using radio frequency (RF) power to perform deposition on the substrate when pressure and substrate temperature are set, a sputtering process in which gaseous ions having high energy in plasma formed by RF power or direct current (DC) power collide with a target surface, and atoms to be deposited are sputtered from the target and deposited on the substrate, a photolithography process of selectively radiating light to a PR using a mask having a desired pattern to form the same pattern as the mask pattern according to a principle that when a photosensitive chemical (e.g., PR) reacts with light, its properties are changed, and an etching process using a phenomenon that a reactive material such as atoms or radicals produced from gas plasma reacts with the material deposited on the substrate and is converted into a volatile material.

The cell process includes an alignment layer deposition process of forming alignment layers on a lower substrate on which a TFT is formed and an upper substrate on which a color filter is formed, a rubbing process of causing liquid crystals to be aligned on the alignment layer, a spacer process of dispensing spacers, and a liquid crystal injection process of attaching the upper substrate and the lower substrate to each other, injecting liquid crystals thereinto, and then sealing an injection hole.

In the module process, a quality of a product finally provided to a user is determined. In this process, a polarizing film is attached to a completed panel, a driver integrated circuit (IC) is mounted, a printed circuit board (PCB) is assembled, and finally a backlight unit and a chassis are assembled.

In the photolithography process of the TFT process among these LCD manufacturing processes, light is selectively radiated to a PR which reacts with light to have a changed property through a mask having a desired pattern, thereby forming the same pattern as the mask pattern.

Such a photolithography process is carried out in order of a PR coating operation of coating a deposited thin film, that is, a glass surface, with a PR, an exposure operation of selectively radiating light using a mask, and a development operation of removing the PR in an illuminated portion using a developer to form a pattern.

Among coating apparatuses used for PR coating in the PR coating operation, a "spinless coater" includes, as shown in FIG. 1, a coater chuck 10 for fixing a glass G, a nozzle 12 for spraying a PR solution while moving over an upper surface of the glass G fixed by the coater chuck 10, and a cleaning unit 20 for cleaning the nozzle 12.

As shown in FIG. 2, the cleaning unit 20 is in the form of one module composed of a cleaner 22, a priming roller 24, and a standby unit 26, and is disposed on one side of the coater chuck 10.

Such a coating apparatus operates in a normal mode in which the nozzle 12 repeatedly sprays a PR solution and an idling mode in which the nozzle 12 temporarily stops spraying the PR solution. Operations of the nozzle 12 according to the modes will be described below.

First, in the normal mode, a coating process in which the nozzle 12 sprays a PR solution to the surface of the glass G to perform PR coating, a cleaning process in which, after the coating operation for the one glass G is finished, the nozzle 12 returns to the cleaning unit 20 and is cleaned in the cleaner 22, and a preparation process in which the PR solution of the nozzle 12 is dispensed by the priming roller 24 to enter a spray preparation state are performed in sequence. After the preparation process, the coating process is repeated so that coating operations for a plurality of glasses are continuously carried out.

In the preparation process for the spray preparation state, the PR at the front end of the nozzle 12 may be dried until the next glass is prepared after the one glass G is coated, and thus the PR solution is dispensed little by little. Such a PR dispensation also prevents a cleaning solution from entering the nozzle 12 while cleaning is performed by a mobile cleaner 23.

In the cleaning process, the mobile cleaner 23 installed at the cleaner 22 moves and cleans the nozzle 12.

In the idling mode, after the nozzle 12 having finished the coating process undergoes a cleaning process and a preparation process, it is moved to the standby unit 26 and undergoes a standby process of being dipped into a PR solution P contained in the standby unit 26. After a predetermined time, the cleaning process is performed again.

In other words, in the idling mode, the nozzle 12 is dipped into the PR solution P during the standby process to prevent the PR solution remaining in the nozzle 12 from being completely dried and to smoothly perform a restarted coating process.

The dipping operation is performed by moving the nozzle 12 up and down. This is enabled because the nozzle 12 has an operation structure capable of moving up and down due to the characteristics of spinless coating that a PR dispensing operation should be precisely performed.

However, the conventional spinless coater including such a cleaning unit has some problems. The PR may be dried on the outside of the nozzle 12 dipped in the idling mode and hinder a nozzle cleaning operation. Also, the PR solution P contained in the standby unit 26 may become hard and cause problems. Furthermore, it is difficult to maintain an appropriate amount of PR in the standby unit 26.

Lately, substrates have become larger and are damaged by even a small impact. To prevent such damage, substrates are floated and conveyed in the air, and a method of performing each unit process with a substrate floated over a stage not to contact the stage surface is under research. For this reason, coating apparatuses require an air-floating stage, and are required to form a coating layer with a substrate floated in the air.

SUMMARY OF THE INVENTION

Accordingly, the present invention is directed to a spinless coating apparatus and a method of forming a coating layer using the same that substantially obviate one or more of the problems due to limitations and disadvantages of the related art.

An advantage of the present invention is to provide a spinless coating apparatus capable of preventing a nozzle from being polluted without priming and maintaining the degree of precision in a Z-axis direction with a substrate floated over a stage to prevent deterioration of coatability of a photoresist (PR), etc.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a coating apparatus includes: a nozzle having a nozzle front end configured to spray a coating solution and a head configured to store the coating solution; a movement axis configured to cause the nozzle to move back and forth in a straight line; a rotating connection member configured to connect the movement axis with the nozzle and allow the nozzle to rotate; a stage disposed under the movement axis; and a cleaning means disposed at an end of the movement axis, and having a nozzle front end insertion unit in a concave shape of the nozzle front end and a base fixing the insertion unit, wherein the nozzle is fixed in a normal direction of a surface of the stage by the movement axis, moves back and forth in an extension direction of the movement axis, and rotates with respect to the movement axis.

In another aspect, a method of forming a coating layer using a coating apparatus including a nozzle having a nozzle front end configured to spray a coating solution and a head configured to store the coating solution, a movement axis configured to cause the nozzle to move back and forth in a straight line, a rotating connection member configured to connect the movement axis with the nozzle and allow the nozzle to rotate, a stage disposed under the movement axis, and a cleaning means disposed at an end of the movement axis and having a nozzle front end insertion unit in a concave shape of the nozzle front end and a base fixing the insertion unit, wherein the nozzle is fixed in a normal direction of a surface of the stage by the movement axis, moves back and forth in an extension direction of the movement axis, and rotates with respect to the movement axis, includes: moving the nozzle front end to the one end of the movement axis to dispose the nozzle front end to face the nozzle front end insertion unit of the cleaning means; moving the nozzle front end insertion unit up to closely adhere the nozzle front end insertion unit close to the nozzle front end; moving the nozzle front end along the movement axis to clean the nozzle front end; floating a substrate in the air to mount the substrate over the stage to be spaced apart from the stage by a predetermined distance; rotating the cleaned nozzle front end to be aligned with one end of the substrate mounted over the stage; a dwelling operation of pre-dispensing a coating solution at the nozzle front end to fill a gap between the nozzle front end and the substrate with the coating solution; and spraying the coating solution while moving the nozzle front end along the movement axis at a predetermined speed to form a coating layer on the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

Figure 1:
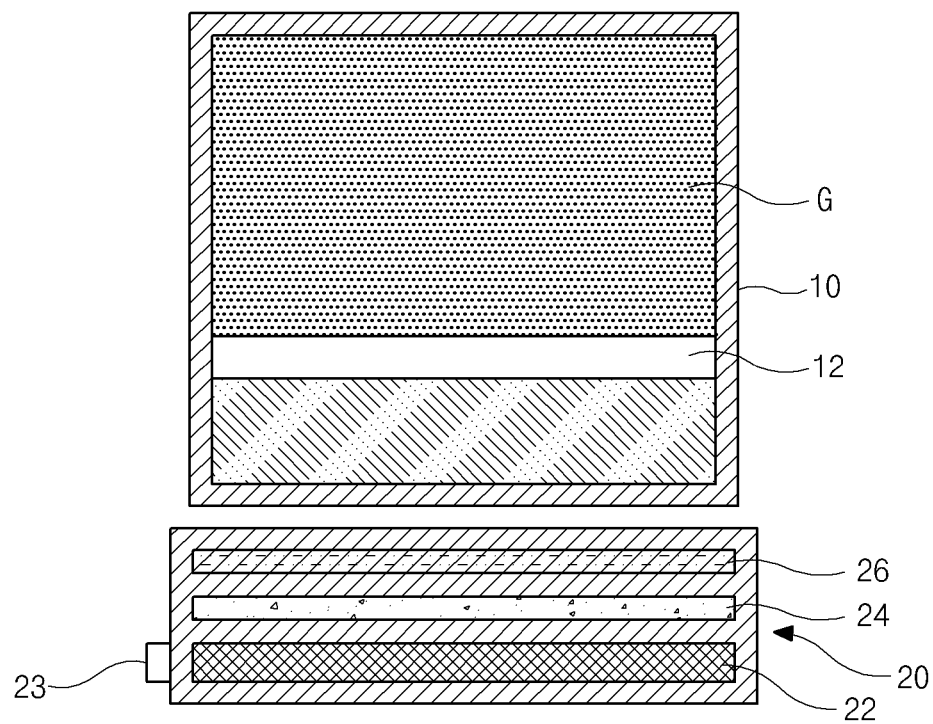
FIG. 1 is a plan view schematically showing a nozzle cleaning unit of a spinless coater and a coating process using a nozzle according to a conventional art.
Figure 2:
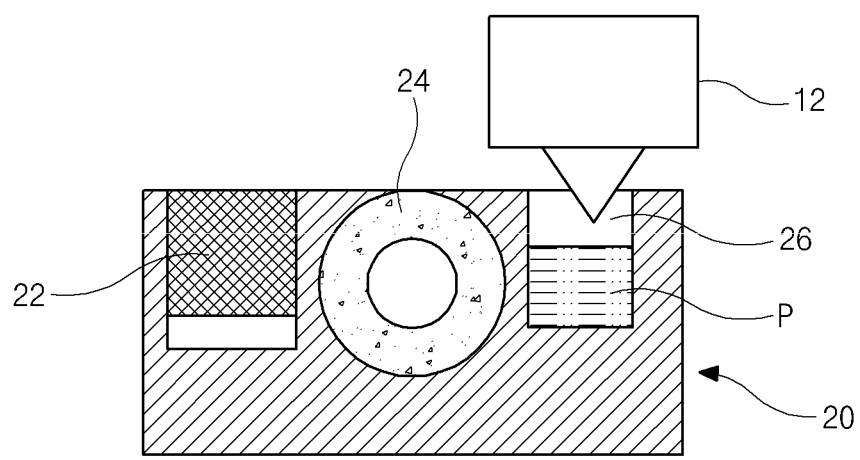
FIG. 2 is a schematic cross-sectional view of the nozzle cleaning unit employed in the conventional spinless coater.
Figure 3:
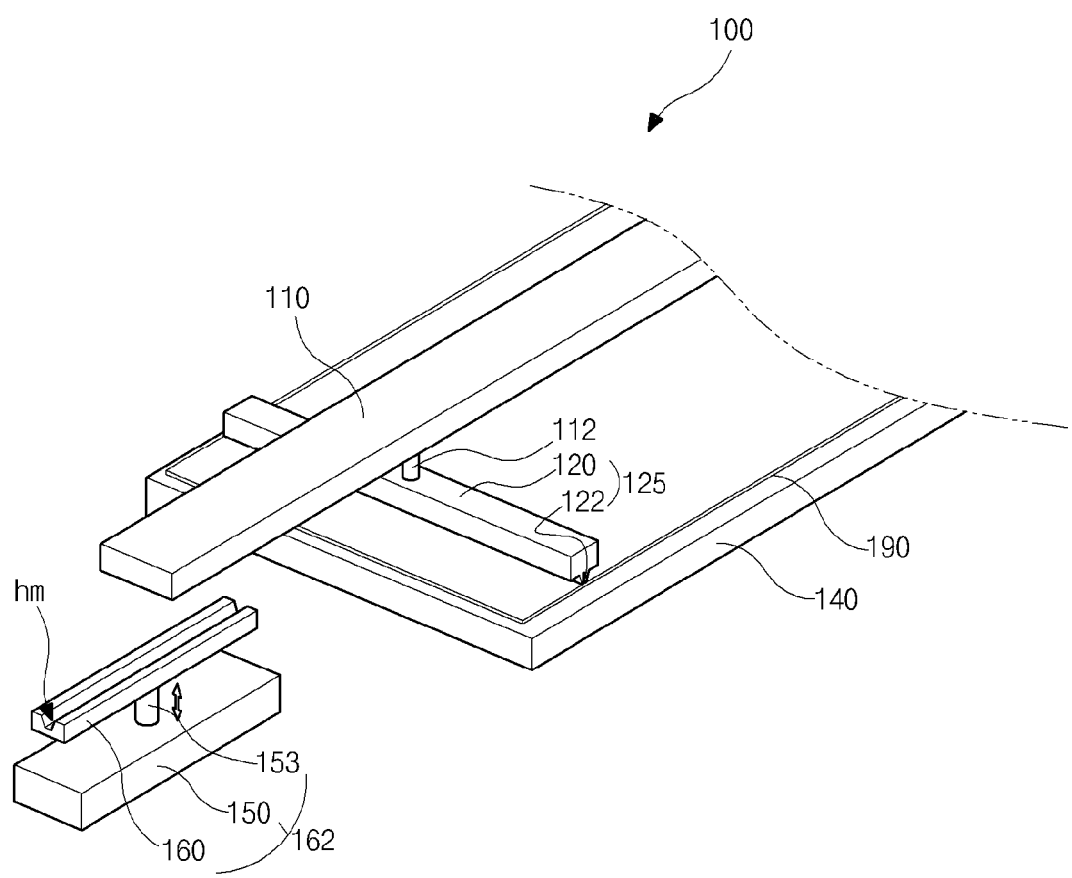
FIG. 3 is a perspective view of a spinless coating apparatus according to an exemplary embodiment of the present invention.

FIG. 3 is a perspective view of a spinless coating apparatus according to an exemplary embodiment of the present invention.

As shown in the drawing, a spinless coating apparatus 100 according to an exemplary embodiment of the present invention includes a nozzle 125 configured to spray a coating solution, a movement axis 110 configured to cause the nozzle 125 to move in a straight line and fix the nozzle 125 in a Z-axis direction, a rotating connection member 112 configured to connect the nozzle 125 with the movement axis 110 and rotate the nozzle 125, a stage 140 over which a substrate is mounted and floated, and a cleaning means 162 for cleaning a nozzle front end 122.

The nozzle 125 configured to spray the coating solution to the substrate is made of a metal, and includes the nozzle front end 122 from which the coating solution is sprayed and a nozzle head 120 configured to supply the coating solution to the nozzle front end 122. As the nozzle front end 122, a bar as long as a substrate width is fixed at a predetermined distance from the substrate 190, and has a pentagonal cross-section whose tips are pointed.

Meanwhile, the nozzle head 120 is supplied with the coating solution from the outside, stores the coating solution, and supplies an appropriate amount of the stored coating solution to the nozzle front end 122.

Also, the nozzle head 120 is fixed to the movement axis 110 extending in one direction by the rotating connection member 112. Due to such a structure, the nozzle front end 122 is stably fixed in the Z-axis direction, that is, a normal direction of the stage 140. Here, the nozzle head 120 is fixed to the movement axis 110 and can be rotated from 90 degrees to 360 degrees by the rotating connection member 112.

The reason that the nozzle 125 is fixed to the movement axis 110 not to move in the Z-axis direction is for process stability. A substrate 190 floated in the air over the stage 140 actually has a slight error in height from a surface of the stage 140 due to air floatation. When the nozzle 125 moves also in the Z-axis direction in this situation, a height error range increases, and coating stability deteriorates.

If the nozzle 125 can move in the Z-axis direction, vertical motion is continuously performed. The repeated vertical motion may deteriorate height reproducibility in the Z-axis. In this case, the function of managing the nozzle front end 122 remarkably deteriorates, which may increase coating process defects. To prevent this problem, the nozzle 125 of the coating apparatus 100 according to an exemplary embodiment of the present invention is fixed and does not move in the Z-axis direction.

The stage 140 is connected with a substrate transfer path (not shown), which is a transfer path of the substrate 190, so that the substrate 190 is floated and moved in the air to be mounted over the stage 140 at a predetermined distance, or has a loader (not shown) and an unloader (not shown) so that the substrate 190 is mounted on the stage 140.

Lately, the substrates 190 have become larger, and substrate transfer paths (not shown) have been prepared to minimize damage caused by contact with another component when the substrate 190 is moved. The coating apparatus 100 according to an exemplary embodiment of the present invention also has a plurality of holes (not shown) configured to discharge air having appropriate pressure to float the substrate 190 in parallel with the surface of the stage 140 at a predetermined height over the surface of the stage 140 according to such an air-floating transfer scheme.

Due to such a structure, the large-area substrate 190 can be floated in the air and continuously moved to the stage 140 through the substrate transfer path (not shown).

Meanwhile, the most remarkable characteristic of the coating apparatus 100 according to an exemplary embodiment of the present invention is the cleaning means 162 prepared at one end of the movement axis 110 at which the nozzle head 120 is fixed. The cleaning means 162 has a nozzle front end insertion unit 160 having a groove hm in a concave shape of the nozzle front end 122 so that the nozzle front end 122 can be inserted. The cleaning means 162 has a base 150 configured to maintain the nozzle front end insertion unit 160 fixed even when the nozzle front end insertion unit 160 rubs against the nozzle front end 122, and a vertical drive means 153 for vertically (i.e., in the Z-axis direction) moving the nozzle front end insertion unit 160 on the base 150.

The nozzle front end insertion unit 160 is made of a material having excellent elasticity and an excellent characteristic for removing a coating solution on a surface of the nozzle front end 122, for example, rubber or high-elastic sponge.

The reason that vertical drive means 153 is prepared in the cleaning means 162 to vertically move the nozzle front end insertion unit 160 is that the nozzle front end 122 and the nozzle head 120 need to be fixed in the vertical direction, that is, the Z-axis direction, due to the characteristics of the coating apparatus 100 according to an exemplary embodiment of the present invention, and the nozzle front end insertion unit 160 needs to be closely adhered to the nozzle front end 122 due to the characteristics of the cleaning means 162 according to an exemplary embodiment of the present invention.

A method of forming a coating layer on a substrate using the coating apparatus having the above-described constitution according to an exemplary embodiment of the present invention will be described below.

Figure 4A:
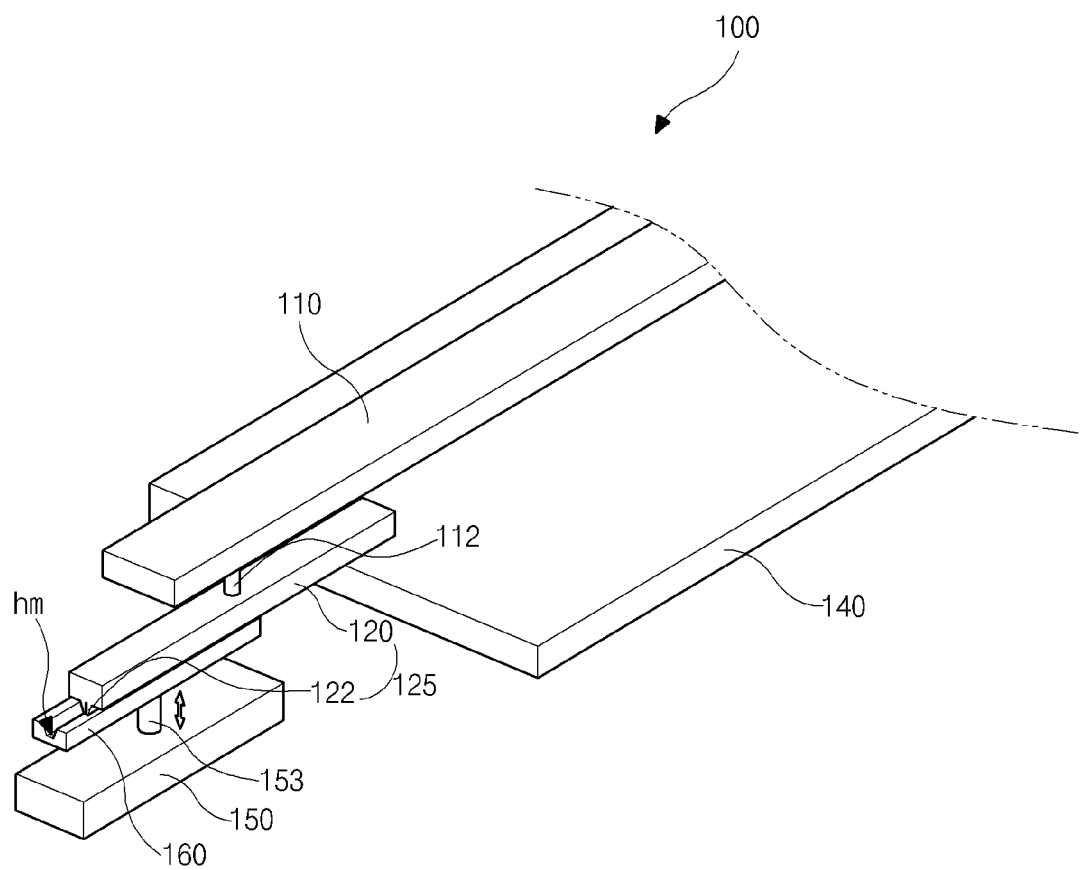
FIGS. 4A to 4C are views illustrating a process of forming a coating layer on a substrate using the coating apparatus according to an exemplary embodiment of the present invention.
Figure 4B:
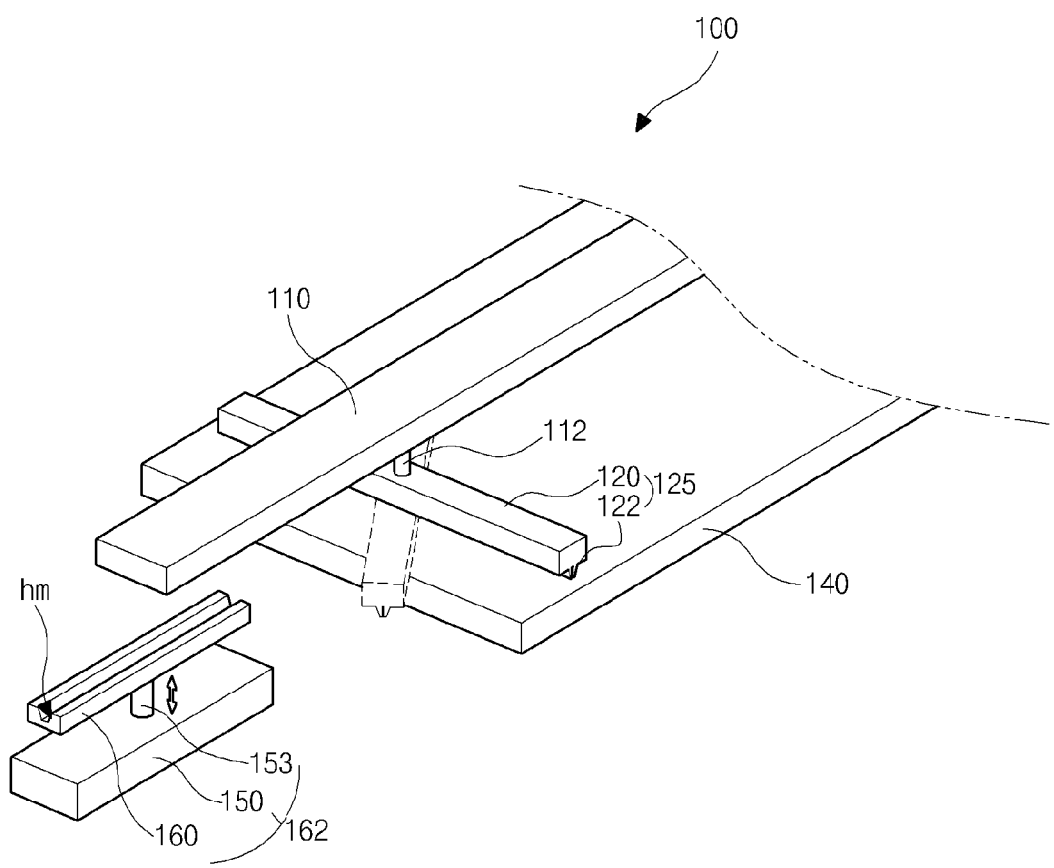
Figure 4C:
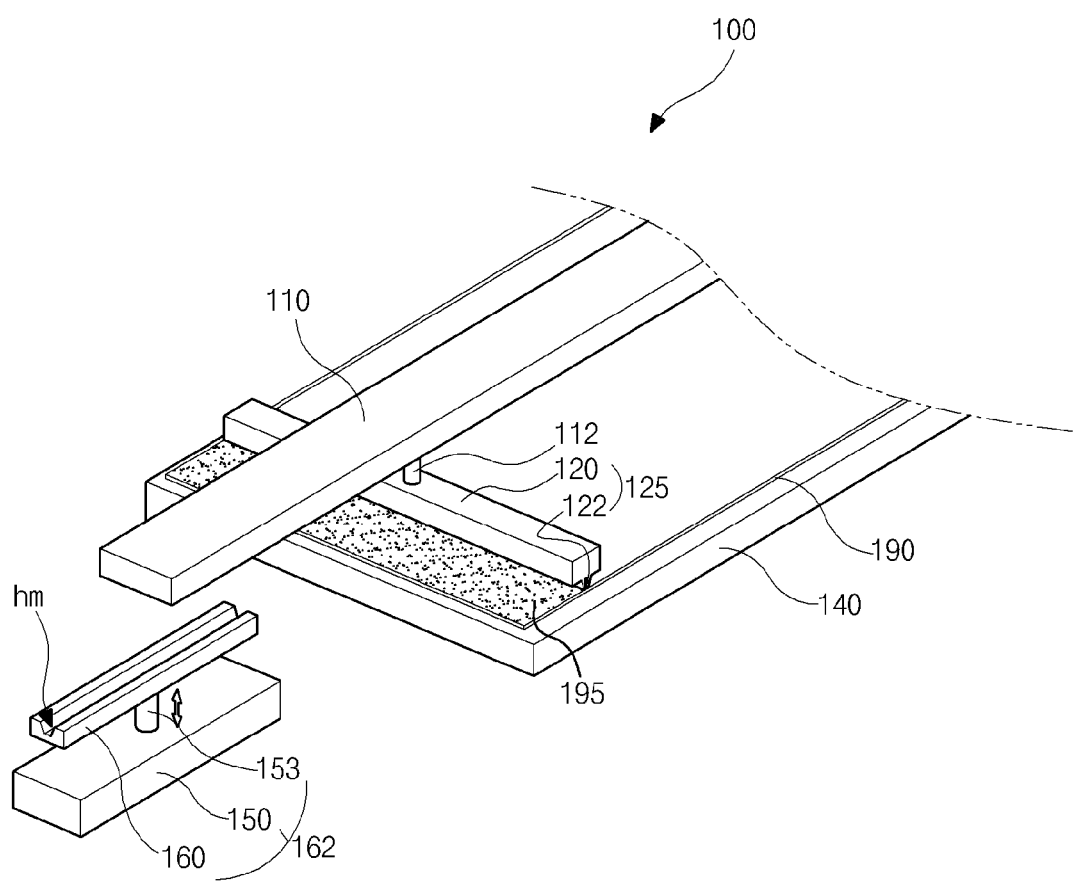

FIGS. 4A to 4C are views illustrating a process of forming a coating layer on a substrate using the coating apparatus 100 according to an exemplary embodiment of the present invention.

First, as shown in FIG. 4A, the nozzle head 120 and the nozzle front end 122 are moved to one end of the movement axis 110 at which the cleaning means 162 is present. At this time, a length direction of the nozzle front end insertion unit 160 of the cleaning means 162 is disposed in the same direction as the movement axis 110, and thus a long axis of the nozzle front end 122 is disposed in parallel with the movement axis 110.

Thereafter, when the nozzle front end 122 is disposed to face the nozzle front end insertion unit 160 of the cleaning means 162, the nozzle front end insertion unit 160 is moved up by the vertical drive means 153 to be closely adhered to the nozzle front end 122 with no space therebetween.

Subsequently, while the nozzle front end insertion unit 160 and the nozzle front end 122 are closely adhered to each other, the nozzle front end 122 and the nozzle head 120 are slowly moved along the movement axis 110 to remove a coating solution on the nozzle front end 122. When the nozzle front end 122 slowly moves in the nozzle front end insertion unit 160, the coating solution on the nozzle front end 122 is transferred to the nozzle front end insertion unit 160. This is because the coating solution has higher adhesion to the nozzle front end insertion unit 160 made of rubber, high-elastic sponge, etc. than the metallic nozzle front end 122, and there is another force such as a frictional force.

For this reason, the coating solution on the nozzle front end 122 is completely removed.

In comparison with conventional priming and a cleaning method of dipping a nozzle front end into a coating solution, the cleaning of the nozzle front end 122 is performed within a short time and does not require a cleaning solution, etc. Thus, the coating solution contained in the nozzle front end 122 is not polluted. Also, since the coating solution does not remain on the surface of the nozzle front end 122, a failure such as a horizontal line defect does not occur during a coating process.

When the cleaning of the nozzle front end 122 is finished, the nozzle front end insertion unit 160 of the cleaning means 162 is moved down and fixed to the base 150. At this time, although not shown in the drawing, a cleaning solution, etc. is sprayed on the nozzle front end insertion unit 160 to remove the remaining coating solution transferred from the surface of the nozzle front end 122 and make the nozzle front end insertion unit 160 clean.

As shown in FIG. 4B, the cleaned nozzle front end 122 is moved along the movement axis 110 to a portion at which one end of the stage 140 is disposed and rotates through 90 degrees so that a width of the end of the stage 140 is aligned with the long axis of the nozzle front end 122.

While the cleaning and movement of the nozzle front end 122 are performed, the substrate 190 floated in the air is moved through a substrate transfer path (not shown) and disposed over the stage 140. At this time, the stage 140 also discharges air through a plurality of holes at a predetermined pressure so that the substrate 190 does not come in contact with a surface of the stage 140. Thus, the substrate 190 is floated in the air at a predetermined distance from the surface of the stage 140.

Since the substrate 190 does not come in contact with the surface of the stage 140 and is kept in a floated state in the air, it is possible to prevent scratches or damage caused by contact with the surface of the stage 140. Also, by preventing contact with a pollution source such as fine dust on the stage 140, it is possible to prevent pollution of the substrate 190 and introduction of a foreign substance, etc.

Figure 5:
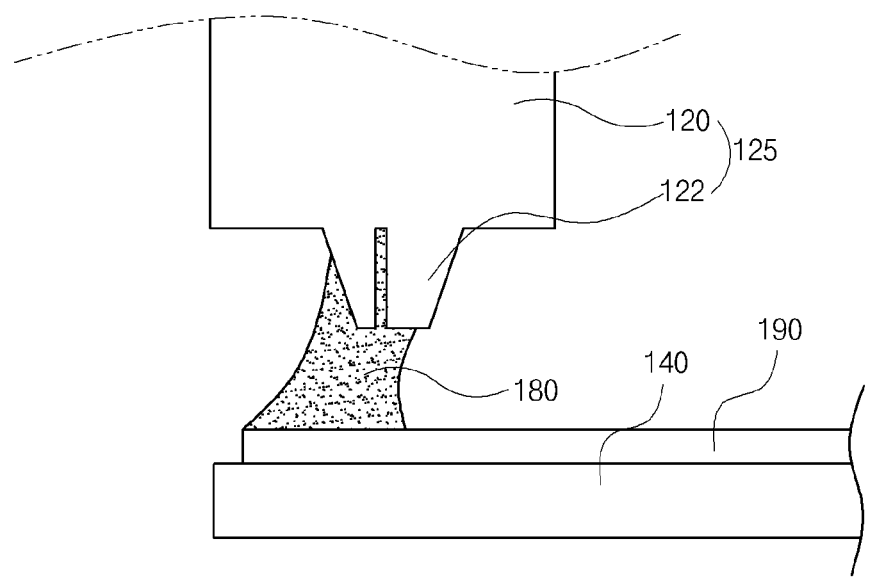
FIG. 5 is a view illustrating a dwelling operation in the process of forming the coating layer using the coating apparatus according to an exemplary embodiment of the present invention.

Subsequently, as shown in FIG. 4C, a pre-dispense process of spraying a predetermined amount of a coating solution 180 from the nozzle front end 122 is performed with the nozzle front end 122 disposed at one end of the substrate 190 floated in the air over the stage 140, and a dwelling process of gradually spraying the predetermined amount of the coating solution 180 is continuously performed so that a gap between the nozzle front end 122 and the substrate 190 is filled with an appropriate amount of the coating solution 180 as shown in FIG. 5 (a drawing illustrating a dwelling process among operations of forming a coating layer using the coating apparatus according to an exemplary embodiment of the present invention).

After this, the appropriate amount of the coating solution 180 is continuously sprayed through the nozzle front end 122 while the nozzle front end 122 and the head 120 are moved along the movement axis 110 at a predetermined speed, thereby forming a coating layer 195 on the substrate 190. Here, the coating solution 180 may be a photosensitive material such as photoresist (PR), an alignment solution such as polyimide, or an organic insulating material such as benzocyclobutene or photo-acryl.

Subsequently, when the nozzle front end 122 arrives at the other end of the substrate 190, the spray of the coating solution 180 is stopped, and the substrate 190 on which the coating layer 195 is formed is moved along the substrate transfer path (not shown) with the distance between the stage 140 and the substrate 190 floated in the air over the stage 140 reduced. At this time, the nozzle front end 122 is rotated again through 90 degrees to be parallel with the movement axis 110, and moved to the one end of the movement axis 110 again to be disposed above the cleaning means 162.

Thereafter, the above-described operations are repeated to continuously form a coating layer on a new substrate.

When the process of forming the coating layer 195 on the substrate 190 is performed using the spinless coating apparatus 100 according to an exemplary embodiment of the present invention as described above, priming does not need to be performed, and time for forming a coating layer per unit area is reduced because cleaning is simply performed using the cleaning means having the nozzle front end insertion unit 160 made of rubber, high-elastic sponge, etc.

Also, since the nozzle front end 122 and the head 120 are fixed to the movement axis 110 and moved back and forth in only one straight line even when the substrate 190 is floated in the air and mounted over the stage 140, the nozzle front end 122 is fixed in the Z-axis direction, that is, in a normal direction of a stage surface. Thus, an error does not occur in the Z-axis direction even when a coating process is repeated. Consequently, a conventional coating defect caused by an error in the Z-axis direction when the nozzle front end 122 is moved in the Z-axis direction is prevented to obtain coating stability.

As described above, a spinless coating apparatus according to an exemplary embodiment of the present invention has a cleaning means capable of vertically (i.e., in a Z-axis direction) moving and made of a specific material. Thus, a nozzle passes through the cleaning means every time before a substrate is coated with a PR, etc., and coating with the coating material is performed with a remaining PR completely removed from a nozzle surface, thereby preventing pollution of the nozzle, a protrusion generated due to a remaining material, and a horizontal line defect.

Also, since the nozzle is fixed in the Z-axis direction and moves back and forth in only one direction, it is possible to prevent deterioration of coatability resulting from deterioration of the degree of precision caused when the nozzle repeatedly moves in the Z-axis direction. Thus, it is possible to prevent a coating defect caused by a thickness difference of a PR, etc.

Further, since priming is omitted, coating time per unit area is reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A coating apparatus, comprising:
a nozzle having a nozzle front end configured to spray a coating solution and a head configured to store the coating solution, wherein the nozzle front end is disposed on the head, the nozzle front end has a bar shape having a first axis in a length direction of the nozzle front end such that a length of the nozzle front end is greater than a width of the nozzle front end, wherein the coating solution is sprayed through an opening in the nozzle front end extending the entire length of the nozzle front end;
a movement axis on which the nozzle moves back and forth in a straight line in an extension direction, the nozzle is fixed to the movement axis by a rotating connection member, the rotating connection member is configured to allow the first axis of the nozzle front end to rotate between directions parallel to the movement axis and perpendicular to the movement axis while the first axis of the nozzle front end remains fixed in the Z-axis direction;
a stage disposed under the movement axis; and
a nozzle front end cleaning mechanism, which is disposed at an end of the movement axis, including a nozzle front end insertion unit defining a groove with a concave shape corresponding to the nozzle front end such that the groove has a length parallel to the extension direction, said nozzle front end insertion unit has a length direction disposed in the same direction as the movement axis, said nozzle front end insertion unit is configured to receive the nozzle front end such that when nozzle front end is disposed to be inserted into the nozzle front end insertion unit for cleaning the first axis of the nozzle front end is parallel with the movement axis;
wherein the nozzle is fixed in a normal direction of a surface of the stage by a height of the movement axis such that a height of the nozzle over the stage is the same as a height of the nozzle over the nozzle front end cleaning mechanism, wherein, when the nozzle moves back and forth in the extension direction of the movement axis, the first axis of the nozzle front end is oriented perpendicular to the extension direction of the movement axis over the stage, and wherein, when the nozzle engages with the nozzle front end cleaning mechanism, the nozzle is rotated with respect to the movement axis so that the first axis of the nozzle front end is parallel to the extension direction of the movement axis.

2. The coating apparatus of claim 1, wherein the nozzle front end cleaning mechanism is configured to vertically move the nozzle front end insertion unit.

3. The coating apparatus of claim 1, wherein the nozzle front end insertion unit is made of rubber or sponge.

4. The coating apparatus of claim 1, wherein a substrate is floated in the air over the stage.

5. The coating apparatus of claim 1, wherein the nozzle front end insertion unit is made of a material such that an adhesion of the coating solution to the nozzle front end insertion unit is higher than an adhesion of the coating solution to the nozzle front end.

6. The coating apparatus of claim 1, wherein the coating solution includes a photoresist coating solution.

7. The coating apparatus of claim 1, wherein a plurality of holes are configured to discharge air to float the substrate over a surface of the stage and in parallel with the surface of the stage.

8. The coating apparatus of claim 7, wherein the air is discharged having a pressure to float the substrate at a predetermined height over the stage.

9. The coating apparatus of claim 1, wherein the nozzle front end cleaning mechanism further includes a base to maintain the nozzle front end insertion unit fixed when engaging with the nozzle front end.

10. The coating apparatus of claim 1, wherein the groove extends an entire length of the nozzle front end cleaning mechanism such that the groove opens to front and back ends of the nozzle front end cleaning mechanism.

* * * * *